US008743619B2

(12) United States Patent
Roohparvar

(10) Patent No.: US 8,743,619 B2
(45) Date of Patent: *Jun. 3, 2014

(54) METHODS OF READING MEMORY CELLS

(71) Applicant: Micron Technolog, Inc., Boise, ID (US)

(72) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/925,118

(22) Filed: Jun. 24, 2013

(65) Prior Publication Data

US 2013/0286739 A1    Oct. 31, 2013

Related U.S. Application Data

(60) Division of application No. 12/824,822, filed on Jun. 28, 2010, now Pat. No. 8,472,254, which is a continuation of application No. 12/368,694, filed on Feb. 10, 2009, now Pat. No. 7,746,700, which is a division of application No. 11/312,101, filed on Dec. 20, 2005, now Pat. No. 7,489,546.

(51) Int. Cl.
| G11C 16/04 | (2006.01) |
| G11C 5/02 | (2006.01) |
| G11C 5/06 | (2006.01) |
| G11C 16/06 | (2006.01) |
| G11C 16/26 | (2006.01) |
| G11C 7/18 | (2006.01) |

(52) U.S. Cl.
USPC ............ 365/185.21; 365/185.05; 365/185.18; 365/185.17; 365/185.23; 365/185.25

(58) Field of Classification Search
USPC ............ 365/185.05, 185.17, 185.18, 185.21, 365/185.23, 185.25
See application file for complete search history.

(56) References Cited

U.S. PATENT DOCUMENTS

| 5,754,482 | A | 5/1998 | Su et al. |
| 5,898,615 | A | 4/1999 | Chida |
| 6,147,910 | A | 11/2000 | Hsu et al. |
| 6,222,762 | B1 | 4/2001 | Guterman et al. |
| 6,646,914 | B1 | 11/2003 | Haddad et al. |
| 6,747,892 | B2 | 6/2004 | Khalid |
| 6,870,770 | B2 | 3/2005 | Roohparvar |
| 6,982,904 | B2 | 1/2006 | Shiga |
| 7,177,197 | B2 | 2/2007 | Cernea |
| 7,489,546 | B2 | 2/2009 | Roohparvar |
| 7,746,700 | B2 * | 6/2010 | Roohparvar ............ 365/185.21 |
| 2002/0159315 | A1 | 10/2002 | Noguchi et al. |
| 2003/0214853 | A1 | 11/2003 | Hosono et al. |
| 2005/0036395 | A1 | 2/2005 | Maejima et al. |
| 2005/0141259 | A1 | 6/2005 | Kang |
| 2005/0185466 | A1 | 8/2005 | Prall |

(Continued)

FOREIGN PATENT DOCUMENTS

WO   WO2004/0161863   7/2004

*Primary Examiner* — J. H. Hur
(74) *Attorney, Agent, or Firm* — Dicke, Billig & Czaja, PLLC

(57) ABSTRACT

Strings of series-coupled memory cells selectively coupled to the same bit line may facilitate increased memory densities, reduced fabrication steps and faster read operations when compared to traditional memory array architectures. Reading of the memory cells may be accomplished using charge sharing techniques similar to read operations in a DRAM device.

21 Claims, 5 Drawing Sheets

(56) References Cited

U.S. PATENT DOCUMENTS

2006/0034140 A1  2/2006  Ogawa et al.
2006/0039197 A1  2/2006  Khouri et al.
2006/0120172 A1  6/2006  Lee et al.

* cited by examiner

METHODS OF READING MEMORY CELLS

RELATED APPLICATION

This Application is a Divisional of U.S. application Ser. No. 12/824,822, filed Jun. 28, 2010 (allowed), which is a Continuation of U.S. application Ser. No. 12/368,694, filed Feb. 10, 2009, now issued as U.S. Pat. No. 7,746,700, which is a Divisional of U.S. application Ser. No. 11/312,101, filed Dec. 20, 2005, now issued as U.S. Pat. No. 7,489,546, all of which are commonly assigned and incorporated herein by reference.

TECHNICAL FIELD

The present invention relates generally to semiconductor memory devices, and in particular, the present invention relates to NAND architecture memory devices and their operation.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density.

For the reasons stated above, and for other reasons stated below which will become apparent to those skilled in the art upon reading and understanding the present specification, there is a need in the art for alternative NAND memory architectures and their operation.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
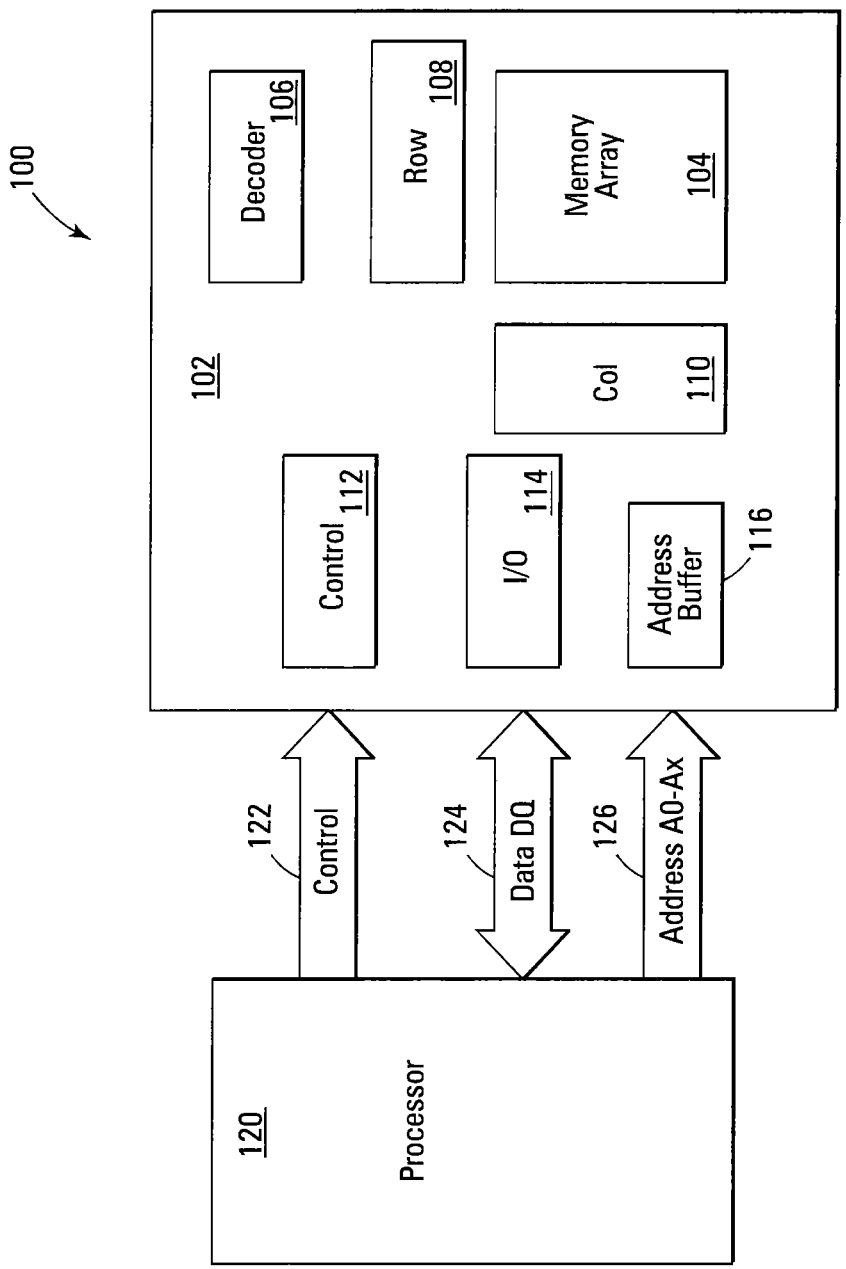
FIG. 1 is a functional block diagram of an electronic system having at least one memory device in accordance with an embodiment of the invention.

FIG. 1 is a simplified block diagram of an electronic system 100, according to an embodiment of the invention. Electronic system 100 includes a non-volatile memory device 102 that includes an array of non-volatile memory cells 104, an address decoder 106, row access circuitry 108, column access circuitry 110, control circuitry 112, Input/Output (I/O) circuitry 114, and an address buffer 116. The array of non-volatile memory cells 104 has an architecture in accordance with an embodiment of the invention.

Electronic system 100 includes an external processor 120, e.g., a memory controller or host processor, electrically connected to memory device 102 for memory accessing. The memory device 102 receives control signals from the processor 120 over a control link 122. The memory cells are used to store data that are accessed via a data (DQ) link 124. Address signals are received via an address link 126 that are decoded at address decoder 106 to access the memory array 104 and selectively apply source potentials. Address buffer circuit 116 latches the address signals. The memory cells are accessed in response to the control signals and the address signals. The control link 122, data link 124 and address link 126 can be collectively referred to as access lines. It will be appreciated by those skilled in the art that additional circuitry and control signals can be provided, and that the memory device of FIG. 1 has been simplified to help focus on the invention.

Figure 2:
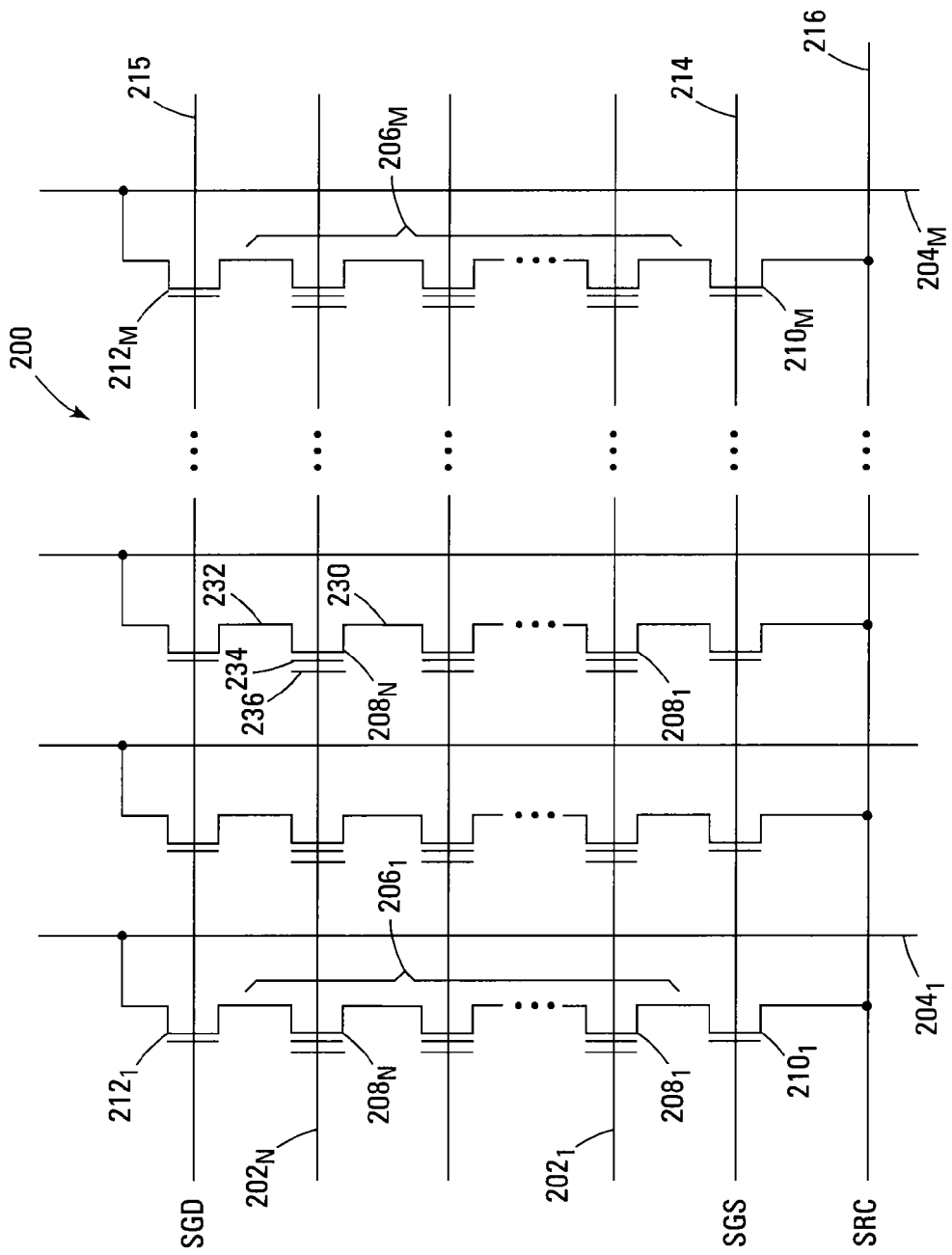
FIG. 2 is a schematic of a portion of an example NAND memory array of the prior art.

FIG. 2 is a schematic of a portion of an example NAND memory array 200 of the prior art included for comparison. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a local bit line 204. The transistors 208, depicted as floating-gate transistors in FIG. 2, represent non-volatile memory cells for storage of data. The floating-gate transistors 208 of each NAND string 206 are connected in series source to drain between a source select gate 210, e.g., a field-effect transistor (FET), and a drain select gate 212, e.g., a FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a local bit line 204 for the corresponding NAND string. For example, the drain of drain select gate $212_1$ is connected to the local bit line $204_1$ for the corresponding NAND string $206_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

To read memory cells in the prior art NAND architecture memory array of FIG. 2, unselected word lines of a block of memory cells are typically operated as pass gates while a selected word line receives a different control potential to allow its data state to determine the conductance of its associated strings of memory cells. In general, a word line associated with a selected row of memory cells is driven at a selected read level voltage, which is typically a low voltage (such as 0V or ground). In addition, the word lines connected to the gates the unselected memory cells of each string are driven by a read pass voltage (such as 4.5V) to operate the unselected memory cells of each string as pass gates. This allows them to pass current in a manner that is unrestricted by their stored data values. In a read operation, current then flows from the source line to the column bit line through each series-connected string, restricted only by the memory cell selected to be read in each string. The data value of a selected memory cell of a string is then determined by sensing a level of current flow through its associated string.

Figure 3:
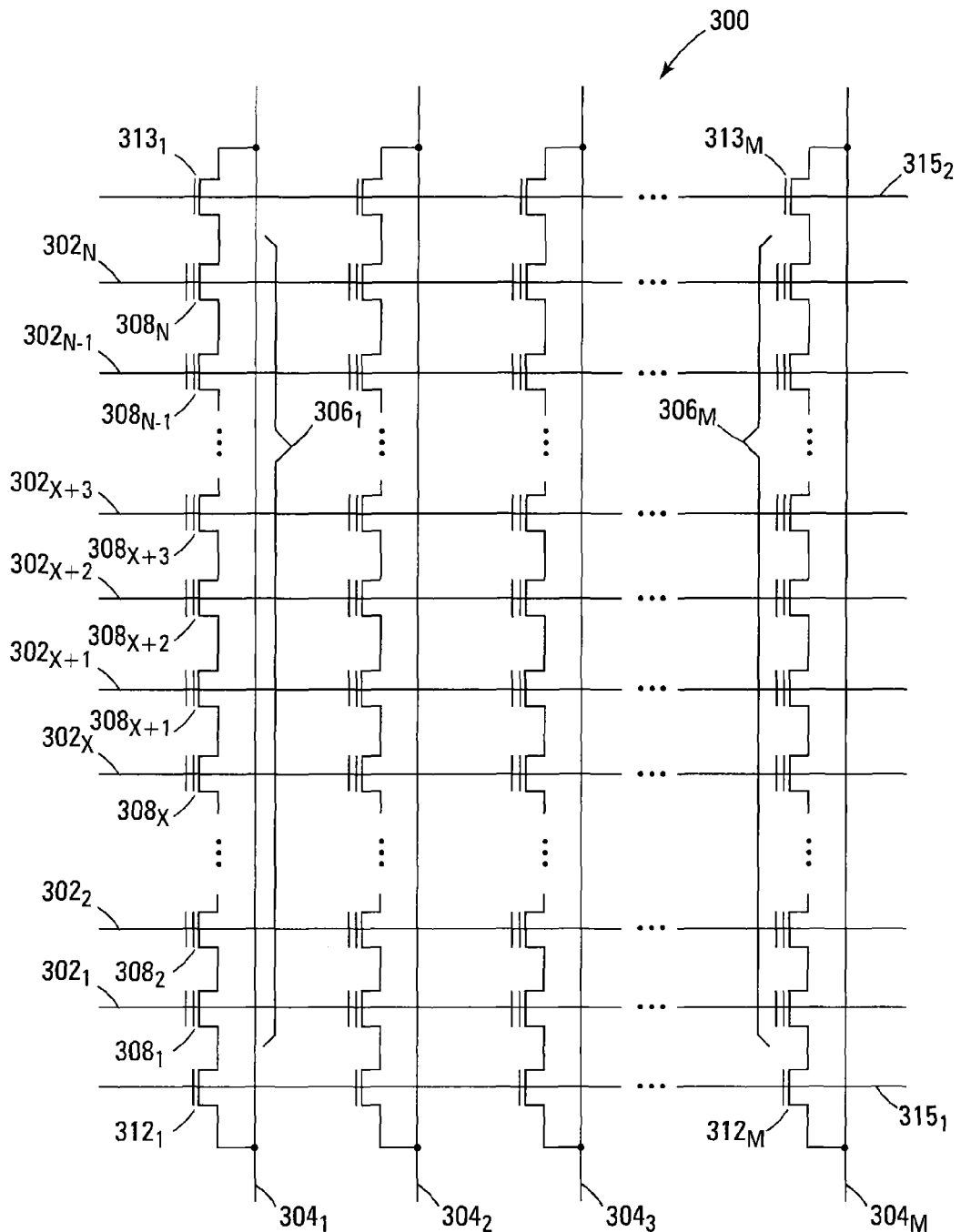
FIG. 3 is a schematic of a portion of a NAND memory array in accordance with an embodiment of the invention.

FIG. 3 is a schematic of a portion of a NAND memory array 300 in accordance with an embodiment of the invention. As shown in FIG. 3, the memory array 300 includes word lines $302_1$ to $302_N$ and intersecting local bit lines $304_1$ to $304_M$. For ease of addressing in the digital environment, the number of word lines 302 and the number of bit lines 304 are generally each some power of two.

Memory array 300 includes NAND strings $306_1$ to $306_M$. Each NAND string includes field-effect transistors $308_1$ to $308_N$, each located at an intersection of a word line 302 and a local bit line 304. The transistors 308, depicted as floating-gate transistors in FIG. 3, represent non-volatile memory cells for storage of data. Although the memory array 300 is depicted as an array of floating-gate transistors, other non-volatile memory technologies capable of defining a data value by a change in threshold voltage may also be used, such as NROM, floating-node, ferroelectric, magnetic and the like. Each data value typically corresponds to mutually exclusive ranges of threshold voltages. The floating-gate transistors 308 of each NAND string 306 are connected in series, sharing source/drain regions with adjacent memory cells, between a first select gate 312, e.g., a FET, and a second select gate 313, e.g., a FET. Each first select gate 312 is located at an intersection of a local bit line 304 and a first select line $315_1$, while each second select gate 313 is located at an intersection of a local bit line 304 and a second select line $315_2$. Unlike the traditional NAND memory array 200 of FIG. 2, the NAND memory array 300 in accordance with an embodiment of the invention has no select gate coupled to a source line. In contrast, the NAND memory array 300 has both select gates 312 and 313 of a NAND string 306 coupled to the same bit line 304.

A first source/drain region of each first select gate 312 is connected to a bit line 304. A second source/drain region of each first select gate 312 is connected to a first source/drain region of the first floating-gate transistor 308 of the corresponding NAND string 306. For example, the first source/drain region of the first select gate $312_1$ is connected to bit line $304_1$ and the second source/drain region of the first select gate $312_1$ is connected to the first source/drain region of floating-gate transistor $308_1$ of the corresponding NAND string $306_1$. At the opposing end of the string, a second source/drain region of each second select gate 313 is connected to the same bit line 304 as its corresponding first source select gate 312 while a first source/drain region of each select gate 313 is connected to a second source/drain region of the last floating-gate transistor 308 of the corresponding NAND string 306. For example, the first source/drain region of source select gate $313_1$ is connected to second source/drain region of floating-gate transistor $308_N$ of the corresponding NAND string $306_1$ and the second source/drain region of the source select gate $313_1$ is connected to the bit line $304_1$.

A column of the transistors or memory cells 308 are those NAND strings 306 coupled to a given local bit line 304. A row of the transistors or memory cells 308 are those transistors commonly coupled to a given word line 302. Other forms of transistors 308 may also be utilized with embodiments of the invention, such as NROM, magnetic or ferroelectric transistors and other transistors capable of being programmed to assume one of two or more threshold voltages indicative of data states.

The NAND strings 306 may be logically divided into two sub-strings. For example, where N is some power of two, a first sub-string, or lower string, may contain memory cells $308_1$ through $308_{N/2}$ and a second sub-string, or upper string, may contain memory cells $308_{N/2+1}$ through $308_N$.

By eliminating the need for a source and source connection, the memory array 300 can be fabricated using less die area and fewer processing steps, thus facilitating increased yield and higher memory densities. In addition, because traditional NAND memory arrays 200 rely on conductance of its NAND strings 206 for read operations, larger string lengths are discouraged due to the increases in resistance which tend to increase read times and make it more difficult to distinguish between different data values. However, as will be explained in more detail below, because NAND memory arrays 300 in accordance with embodiments of the invention rely on capacitance of its NAND strings 306 for read operations rather than conductance, higher string lengths, i.e., more cells per string, will act to increase the available capacitance, thus tending to improve differentiation between data values.

Programming and erasing memory cells 308 of the NAND array 300 can be performed similar to programming and erasing memory cells 208 of the prior-art NAND array 200. For example, to program a target floating-gate memory cell $308_1$, i.e., to increase its threshold voltage by adding charge to its floating gate, the word line $302_1$ containing the target memory cell $308_1$ may receive a programming voltage that is some positive potential capable of programming a memory cell in conjunction with the remaining node voltages. For example, the programming voltage may be about 20V. Unselected word lines 302, i.e., word lines $302_2$-$302_N$ not associated with the target memory cell $308_1$, receive some positive potential capable of causing memory cells on the unselected word lines to act as pass gates during the programming of the selected word line. The pass voltage during programming may be about 10V. The selected bit line 304, i.e., the bit line $304_1$ associated with the target memory cell $308_1$, might receive the ground potential Vss while unselected bit lines 304, i.e., bit lines $304_2$-$304_M$ not associated with the target memory cell $308_1$, might receive a higher potential, such as the supply potential Vcc. Note that while this example describes programming only one target memory cell 308, there may be more than one selected bit line 304 as more than one target memory cell 308 on a give word line 302 can be programmed concurrently.

One set of select gates 312 or 313 might receive the same potential as the selected bit lines 304, such as ground potential Vss, on select line $315_1$ or $315_2$, respectively. The remaining set of select gates 313 or 312 might receive some positive potential, such as the supply potential Vcc, on select line $315_2$ or $315_1$, respectively, sufficient to activate those select gates coupled to selected bit lines. The bulk substrate in which the memory cells 308 are formed might be held at the ground potential Vss.

Erasing of memory cells 308 would generally be performed concurrently to a block of memory cells. For example, to erase the floating-gate memory cell 308, i.e., to decrease their threshold voltages by removing charge from their floating gates, all word lines 302 might receive the ground potential Vss, all bit lines 304 may be electrically floating, and the select lines $315_1$ and $315_2$ may be electrically floating while the bulk substrate in which the memory cells 308 are formed is boosted to some erase voltage, such as 20V.

The foregoing represents just one set of techniques for programming and erasing memory cells of NAND memory array 300. It is noted that because typical programming and erase operations do not make use of the source connection of a traditional NAND memory array, many techniques for programming and erasing a traditional NAND memory array 200 can also be applied to NAND memory arrays 300 in accordance with embodiments of the invention. However, because the NAND strings 306 in accordance with embodiments of the invention eliminate the need for a source connection, typical read operations relying on conductance of a string of memory cells are unsuitable for use with embodiments of the invention.

In contrast to traditional read operations of NAND memory arrays, various embodiments of the invention rely on capacitance of a portion of the string of memory cells during a read operation. A charge is placed on the string of memory cells containing the target memory cell and then selectively released depending upon the data value stored in the target memory cell. The target memory cell or cells are then read using charge sharing techniques to raise or lower a voltage on their associated bit lines. If the charge has been retained, the associated bit line receives the charge and increases its voltage level. If the charge has been released, the associated bit line loses charge to the string and decreases its voltage level. Because no DC current flows through the NAND strings 306 for the read operation, significant power savings can be facilitated over traditional read operations based on current flow. Additionally, the time expected for precharging the strings of memory cells, selectively releasing the charge and reading the data value using charge sharing techniques is expected to be on the order of several hundred nanoseconds versus several microseconds used for traditional conductance read operations.

Figure 4:
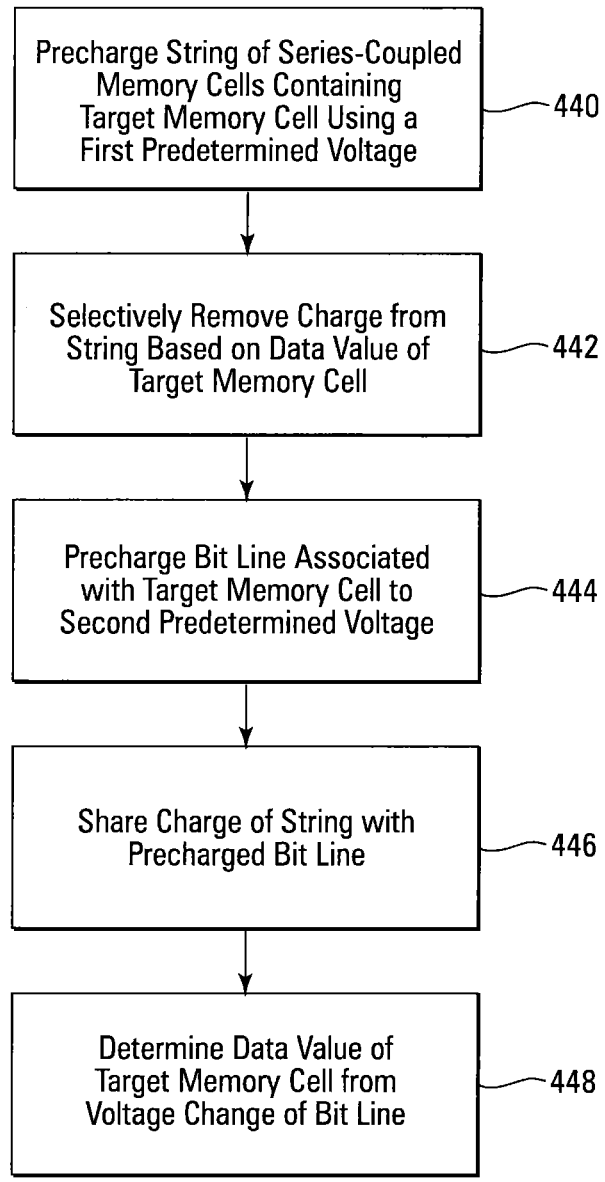
FIG. 4 is a flow chart of a method of reading memory cells in accordance with an embodiment of the invention.

FIG. 4 is a flow chart of a method of reading memory cells in accordance with an embodiment of the invention. At 440, the strings of memory cells containing the target memory cells, i.e., the memory cells to be read, are precharged using a first predetermined voltage. Typically, a read operation would read memory cells 308 coupled to a selected word line 302 across a number of bit lines 304.

For precharging the NAND string $306_1$, the bit line $304_1$ could be driven to the first predetermined voltage, such as the supply potential Vcc and the word lines $302_1$-$302_N$ could be driven to some potential, such as a read voltage Vread. The read voltage Vread is generally some voltage greater than Vcc and sufficient to operate the memory cells 308 as pass gates regardless of their data values, e.g., 4.5V. One of the select lines, such as select line $315_2$ at one end of the NAND string $306_1$, would receive a potential, such as the ground potential Vss, to deactivate its associated select gate $313_1$ to isolate that end of the string $306_1$ from the bit line $304_1$. The remaining select line, select line $315_1$ in this case, would receive a potential to activate its associated select gate $312_1$, thus coupling the NAND string $306_1$ to the bit line $304_1$.

If the select line $315_1$ receives a potential at least one threshold voltage of the select gate $312_1$ above the first predetermined voltage, the NAND string $306_1$ could precharge to approximately the first predetermined voltage. For example, the select line $315_1$ may be driven to the read voltage Vread. For simplicity, it may be desirable to simply drive the select line $315_1$ with the supply potential Vcc as well, resulting in charging of the NAND string $306_1$ to approximately Vcc minus the threshold voltage of the select gate $312_1$ in this example. Other voltages could also be used. However, lower precharging levels will reduce the voltage differentials indicative of a programmed versus an erased memory cell as they would reduce the amount of stored charge. Note that the stored charge may be a positive or negative charge depending upon the chosen voltage.

Although precharging may occur from either end of a NAND string 306, it may be preferred to precharge the NAND string 306 from the end farthest away from the target memory cell 308. For example, where the NAND strings 306 are logically divided into lower and upper stings, when any memory cell 308 in the lower string is being read, the NAND string 306 would be isolated from the bit line 304 by deactivating the select gate 313 nearest the upper string, and when any memory cell 308 in the upper string is being read, the NAND string 306 would be isolated from the bit line 304 by deactivating the select gate 312 nearest the lower string. This may simplify the logic to decide which select gate to deactivate. Regardless, it is desirable to store the charge in the largest portion of the NAND string 306 available between the target memory cell 308 and one of the select gates 312 or 313. For a further embodiment, assuming a target memory cell $308_{x+1}$, if the quantity (N−(x+1)) is greater than x, the portion of the NAND string $306_1$ between memory cell $308_{x+1}$ and select gate $313_1$ may be utilized to provide the charge storage area regardless of whether the NAND strings 306 are logically divided into lower and upper strings. Otherwise, the portion of the NAND string $306_1$ between memory cell $308_{x+1}$ and select gate $312_1$ could be utilized to provide the charge storage area.

Upon precharging, the select line $315_1$ may receive a potential, such as the ground potential, to deactivate the select gate $312_1$ to isolate the NAND string $306_1$ from the bit line $304_1$ to hold its charge. However, the read operation may proceed without isolating both ends of the NAND string $306_1$ from the bit line $304_1$.

At 442, charge stored on the NAND strings is selectively removed based on the data values of the target memory cells. To selectively remove charge, it is preferred that the end of the NAND string farthest from the target memory cell remain isolated from its associated bit line. This allows the largest portion of the string to act as the storage node for any remaining charge. As one example, the selected word line $302_1$ coupled to the target memory cell $308_1$ may receive a potential to activate the memory cell if it has a first data value, e.g., "1" or erased, and to deactivate the memory cell if it has a second data value, e.g., "0" or programmed. For example, in floating-gate memory cells, an erased memory cell generally has a threshold voltage of less than 0V while a programmed memory cell might have a threshold voltage of around 1V or higher. Thus, by applying the ground potential Vss to the selected word line $302_1$, the target memory cell $308_1$ will be activated if it has the first data value and deactivated if it has the second data value. By dropping the bit line $304_1$ to the ground potential Vss, while the select gate $313_1$ is deactivated, the select gate $312_1$ is activated and the unselected word lines are acting as pass gates, the NAND string $306_1$ would lose its charge to the bit line $304_1$ if the memory cell $308_1$ were activated. However, if the memory cell $308_1$ were deactivated, charge would be retained in that portion of the NAND string $306_1$ between the target memory cell $308_1$ and the select gate $313_1$.

At 444, the bit lines 304 to be read are precharged to a second predetermined voltage. The precharging may occur with the NAND strings 306 isolated from the bit lines 304, such as by deactivating both select gates 312 and 313. Alternatively, the precharging may occur while the one end of a NAND string 306 remains coupled to the bit line 304 after selectively removing any stored charge, provided the selected word line 302 is first driven to deactivate all of its memory cells 308, regardless of their data values.

For one embodiment, the second predetermined voltage is an intermediate value between the first predetermined voltage and the bit line voltage used when selectively removing charge from the NAND strings. In this manner, if a stored charge is retained, charge sharing will tend to drive the bit line in one direction from the second predetermined voltage, and if the stored charge is removed, charge sharing will tend to drive the bit line in an opposite direction from the second predetermined voltage. For example, if a NAND string 306 was charged to the supply potential Vcc, and the resulting stored charge were retained in at least half of the string, sharing the stored charge from the NAND string 306 would tend to increase the potential of a bit line 304 if it were precharged to a second predetermined voltage of Vcc/2 or lower. Similarly, if a NAND string 306 was discharged to the ground potential Vss, charge sharing with the NAND string 306 would tend to decrease the potential of the bit line 304 if it were precharged to a second predetermined voltage of greater than Vss. In this example, the second predetermined voltage would then be chosen to be some value greater than Vss and less than or equal to Vcc/2. For example, a second predetermined voltage of Vcc/3 might be used in this scenario. If that portion of the NAND strings 306 not used as the storage node is precharged to the second predetermined voltage, or where charge sharing occurs through the end of the NAND string 306 used as the storage node, a wider window of operation is possible as no charge is lost in equilibrating the NAND strings 306. In this situation, it may be possible chose a second predetermined voltage to be some value greater than Vss and less than or equal to Vcc under conditions of the foregoing example. For some embodiments, the second predetermined voltage may further have a value equal to the bit line voltage used when selectively removing charge from the NAND strings. However, in this scenario, if the charge is removed at 442, the data value of the memory cell would be indicated by no change in the bit line voltage upon equalization with the NAND string 306.

At 446, charge sharing occurs between the NAND strings 306 and their associated bit lines 304 by equalizing the two. Although charge sharing may be performed through either end of the NAND string 306, it may be preferable to charge share through the end of the NAND string 306 that is being used as the capacitive storage node. However, as noted above, proper selection of the bit line precharge voltage would allow operation in either manner. As one example, charge sharing might be accomplished by driving all word lines 302 to the pass voltage Vpass to act as pass gates while activating one or both of the select gates 312 or 313. Alternatively, the selected word line 302 could continue to receive the read voltage Vread while the unselected word lines receive the pass voltage Vpass. The select gate 312 or 313 associated with the end of the NAND string 306 used as a charge storage node could then be activated. If the target memory cell 308 has the first data value such that its transistor is activated, the associated bit line 304 would equilibrate with the entire NAND string 306, whose charge would have been removed at 442. If the target memory cell 308 has the second data value such that its transistor is deactivated, the retained charge in a first portion of the NAND string 306 would be shared with the bit line 304 while the remaining portion of the NAND string 306 could remain isolated from the bit line 304.

At 448, the data values of the target memory cells 308 are determined based on the resulting voltage changes of their associated bit lines 304. Sensing of data values in this manner is well understood and is commonly utilized in DRAM devices. As one example, a differential sensing technique could be utilized. In this technique, during the precharging of the bit line at 444, a reference bit line could also be precharged and equalized to the bit line being sensed. The reference bit line would be isolated from the bit line being sensed before performing the charge sharing at 446. By coupling the reference bit line and the bit line being sensed to a differential sense amplifier, after sharing charge with the selected NAND string, it can be determined whether the bit line being sensed has experienced a voltage increase or a voltage decrease relative to the reference bit line. This change is indicative of the data value of the target memory cell. Alternatively, single-ended sensing techniques may also be used. A single-ended sensing device has a single input coupled to a target bit line and often contains an inverter providing an output signal indicative of the potential level of the target bit line and, thus, the data value of the target memory cell. The inverter would generally have a threshold point close to the precharge potential.

Figure 5:
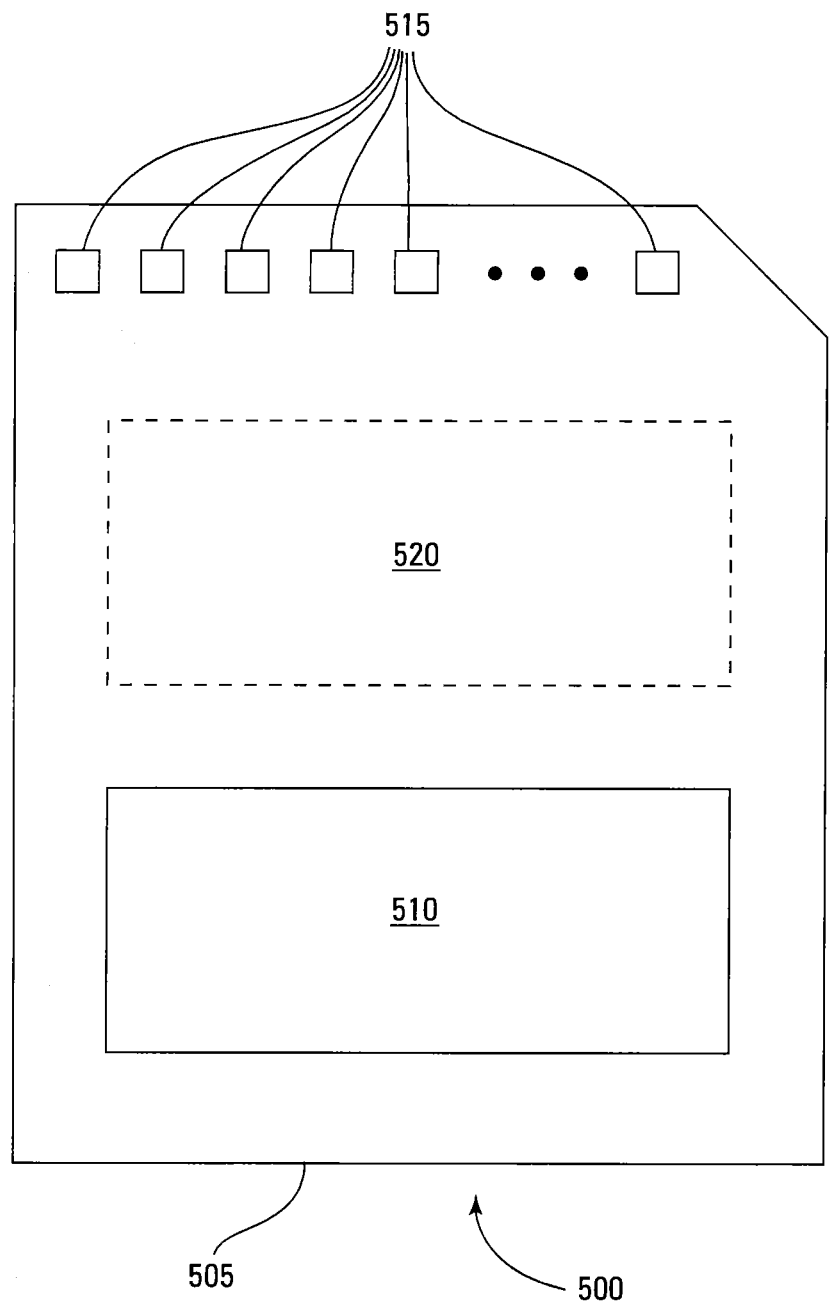
FIG. 5 is a functional block diagram of a memory module having at least one memory device in accordance with an embodiment of the invention.

FIG. 5 is an illustration of an exemplary memory module 500. Memory module 500 is illustrated as a memory card, although the concepts discussed with reference to memory module 500 are applicable to other types of removable or portable memory, e.g., USB flash drives, and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 is a non-volatile memory having a NAND architecture in accordance with an embodiment of the invention. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520 which may be one or more integrated circuits and/or discrete components. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC (application specific integrated circuit). Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

NAND memory array architectures having series-coupled strings of non-volatile memory cells where both ends of the string are selectively coupled to a bit line, and methods of reading a NAND memory array using charge sharing techniques, have been described. Such methods and apparatus facilitate increased memory densities, reduced fabrication steps and faster read operations when compared to traditional NAND memory array architectures.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of reading a target memory cell, comprising:
selectively removing charge from at least a portion of a string of series-coupled memory cells containing the target memory cell string based on a data value of the target memory cell;
equalizing at least the portion of the string with a bit line; and
determining the data value of the target memory cell in response to a voltage change of the bit line after equalizing with at least the portion of the string.

2. The method of claim 1, further comprising precharging the portion of the string of series-coupled memory cells prior to selectively removing the charge.

3. The method of claim 1, further comprising precharging the portion of the string of series-coupled memory cells then isolating the portion of the string of series-coupled memory cells from the bit line prior to selectively removing the charge.

4. The method of claim 3, wherein isolating the portion of the string of series-coupled memory cells from the bit line further comprises isolating a remaining portion of the string of series-coupled memory cells from the bit line.

5. The method of claim 2, wherein precharging the portion of the string of series-coupled memory cells comprises precharging the portion of the string of series-coupled memory cells to a positive potential.

6. The method of claim 5, further comprising precharging the bit line prior to equalizing.

7. The method of claim 6, wherein precharging the bit line comprises precharging the bit line while the portion of the string of series-coupled memory cells is isolated from the bit line.

8. The method of claim 7, further comprising precharging the bit line while a remaining portion of the string of series-coupled memory cells is coupled to the bit line.

9. The method of claim 6, wherein precharging the bit line comprises precharging the bit line to a positive potential less than the positive potential used for precharging the portion of the string of series-coupled memory cells.

10. The method of claim 1, wherein selectively removing charge from at least a portion of a string of series-coupled memory cells comprises selectively removing charge from the portion of the string of series-coupled memory cells containing a majority of the memory cells of the string between the target memory cell and the bit line.

11. A method of reading a target memory cell, comprising:
precharging at least a portion of a string of series-coupled memory cells containing the target memory cell to a first voltage;
selectively, based on a data value of the target memory cell, removing charge from at least the portion of the string to a bit line at a second voltage different than the first voltage;

after selectively removing the charge, equalizing at least the portion of the string with the bit line at a third voltage, wherein the third voltage different than the first voltage; and determining the data value of the target memory cell in response to a voltage of the bit line after equalizing with at least the portion of the string.

12. The method of claim 11, further comprising isolating the portion of the string of series-coupled memory cells from the bit line prior to selectively sharing the charge.

13. The method of claim 12, wherein isolating the portion of the string of series-coupled memory cells from the bit line further comprises isolating the string of series-coupled memory cells from the bit line.

14. The method of claim 11, wherein selecting removing the charge comprises selectively removing a negative charge.

15. The method of claim 11, wherein precharging at least a portion of a string of series-coupled memory cells containing the target memory cell comprises precharging that portion of the string containing more memory cells between the target memory cell and the bit line than a remaining portion of the string between the target memory cell and the bit line.

16. The method of claim 11, wherein determining the data value of the target memory cell in response to a voltage of the bit line comprises determining the data value using a sensing technique selected from the group consisting of a differential sensing technique and a single-ended sensing technique.

17. The method of claim 11, wherein equalizing at least the portion of the string with the bit line at a third voltage comprises a third voltage having a voltage level selected from the group consisting of a voltage level equal to the second voltage and a voltage level between the first voltage and the second voltage.

18. A method of reading a target memory cell, comprising:
precharging at least a portion of a string of series-coupled memory cells containing the target memory cell to a first voltage;

precharging a bit line selectively connected to the string to a second voltage different than the first voltage while the bit line is isolated from at least the portion of the string;

selectively removing charge from at least the portion of the string to the bit line based on a data value of the target memory cell while an end of the string closest to the portion of the string is isolated from the bit line and an end of the string farthest from the portion of the string is connected to the bit line;

precharging the bit line to a third voltage between the first voltage and the second voltage while at least the portion of the string is isolated from the bit line;

equalizing at least the portion of the string with the bit line after precharging the bit line to the third voltage; and determining the data value of the target memory cell in response to a voltage change of the bit line after equalizing with at least the portion of the string.

19. The method of claim 18, wherein precharging at least a portion of a string of series-coupled memory cells containing the target memory cell to a first voltage comprises precharging the string of series-coupled memory cells containing the target memory cell to the first voltage.

20. The method of claim 18, wherein selectively removing charge comprises selectively removing a negative charge.

21. The method of claim 18, wherein equalizing at least the portion of the string with the bit line comprises equalizing the string with the bit line.

* * * * *